(12) United States Patent
Harada

(10) Patent No.: US 10,267,826 B2
(45) Date of Patent: Apr. 23, 2019

(54) BUS BAR MODULE EQUIPPED WITH CURRENT SENSOR FOR MEASURING VALUE OF CURRENT IN THE BUS BAR

(71) Applicant: DENSO CORPORATION, Kariya, Aichi-pref. (JP)

(72) Inventor: Naohisa Harada, Kariya (JP)

(73) Assignee: DENSO CORPORATION, Kariya (JP)

( * ) Notice: Subject to any disclaimer, the term of this patent is extended or adjusted under 35 U.S.C. 154(b) by 186 days.

(21) Appl. No.: 15/311,461

(22) PCT Filed: May 22, 2015

(86) PCT No.: PCT/JP2015/064729
§ 371 (c)(1),
(2) Date: Nov. 15, 2016

(87) PCT Pub. No.: WO2015/178478
PCT Pub. Date: Nov. 26, 2015

(65) Prior Publication Data
US 2017/0082659 A1    Mar. 23, 2017

(30) Foreign Application Priority Data

May 23, 2014 (JP) .................. 2014-106982
Mar. 20, 2015 (JP) .................. 2015-057092

(51) Int. Cl.
*G01R 15/18* (2006.01)
*G01R 15/20* (2006.01)

(52) U.S. Cl.
CPC .................. *G01R 15/20* (2013.01)

(58) Field of Classification Search
CPC .... G01R 15/207; G01R 19/0092; G01R 1/18; G01R 15/20; G01R 15/202; G01R 19/00;
(Continued)

(56) References Cited

U.S. PATENT DOCUMENTS 3,555,476 A * 1/1971 Brennen et al. ........ G01R 27/18
336/175
2005/0156587 A1* 7/2005 Yakymyshyn ....... G01R 15/207
324/117 R
(Continued)

FOREIGN PATENT DOCUMENTS

JP    2008-275321 A    11/2008
JP    2011-209256 A    10/2011
(Continued)

OTHER PUBLICATIONS

Aug. 11, 2015 International Search Report issued in International Patent Application No. PCT/JP2015/064729.

*Primary Examiner* — Vinh P Nguyen
(74) *Attorney, Agent, or Firm* — Oliff PLC

(57) ABSTRACT

A bus bar module equipped with current sensors is provided. The module includes a plurality of bus bars, a current sensor, and shield plates. The current sensor is formed of a magneto-resistive element. The plurality of bus bars are arrayed along a width direction (X direction) of the bus bars that is at right angles to both the thickness direction (Z direction) and the extension direction (Y direction) of the bus bars. The current sensor is arranged being spaced apart from the bus bars, while being adjacent to the bus bars in the Z direction. The bus bars and the current sensor are covered from both sides in the Z direction, by the shield plates.

11 Claims, 19 Drawing Sheets

(58) Field of Classification Search
CPC .... G01R 15/205; G01R 33/093; G01R 33/06; G01R 31/2829; G01R 15/183; G01R 19/16542; G01R 33/0094; G01R 33/04; G01R 15/185; G01R 15/242; G01R 15/247; G01R 19/20; G01R 33/07; G01R 33/09; G01R 33/091; G01R 15/142; G01R 15/16; G01R 15/186; G01R 19/25; G01R 33/025; G01R 35/005; G01R 3/00; G01R 33/063; G01R 33/072; H02G 5/066; H02J 9/061; H02J 7/0052; H02M 3/158; H02M 7/04; H02M 7/44; H04L 67/10

See application file for complete search history.

(56) References Cited

U.S. PATENT DOCUMENTS

2008/0186021 A1* 8/2008 Hashio ............... G01R 15/207
324/225
2013/0169267 A1 7/2013 Miyakoshi et al.
2014/0111196 A1 4/2014 Sakai et al.

FOREIGN PATENT DOCUMENTS

| JP | 2014-006118 A | 1/2014 |
| JP | 2015-049184 A | 3/2015 |

* cited by examiner

BUS BAR MODULE EQUIPPED WITH CURRENT SENSOR FOR MEASURING VALUE OF CURRENT IN THE BUS BAR

This application claims priorities from Japanese Patent Application No. 2014-106982 filed May 23, 2014 and Japanese Patent Application No. 2015-57092 filed Mar. 20, 2015 the contents of which are incorporated herein by reference.

TECHNICAL FIELD

The present invention relates to a current sensor-equipped bus bar module including a plurality of bus bars and a current sensor for measuring values of current in the bus bars.

BACKGROUND ART

A current sensor-equipped bus bar module is known, including a plurality of bus bars and current sensors for measuring values of current in the bus bars (see PTL 1 below). Such a current sensor-equipped bus bar module is used in electronic equipment such as electric power converters, etc.

A Hall element may be used as the current sensor, for example. When a current flows through a bus bar, a magnetic field is generated around the bus bar. The strength of the magnetic field is ensured to be detected by means of the Hall element, and used for calculating the value of the current. The sensitivity of a Hall element to the magnetic field is relatively low. For that reason, a magnetic flux concentrating core is provided surrounding the bus bar, and the Hall element is disposed within a gap that is formed in the magnetic flux concentrating core (see FIGS. 20 and 21). In that way, a strong magnetic field is ensured to act on the Hall element.

Also, for reasons of achieving compactness of the magnetic flux concentrating core and obtaining high sensitivity, etc., the Hall element is disposed near the bus bar. The Hall element is disposed in contact with the bus bar, in many cases.

When AC current flows in a bus bar, an AC magnetic field is generated around the bus bar. As a result, eddy currents may be generated in the magnetic flux concentrating core by the AC magnetic field, so that heating may occur. Hence, there is the problem that, if a magnetic flux concentrating core is used, heat from the magnetic flux concentrating core may be transmitted to the Hall element, which can readily cause a temperature increase of the Hall element. Furthermore, if the Hall element is disposed in contact with the magnetic flux concentrating core, resistive heat generated from the bus bar can readily be transmitted to the Hall element. In that way, since the heat transmitted from the bus bar or the magnetic flux concentrating core causes a temperature rise of the sensor, there is the problem that the operating life of the current sensor will tend to become short, when a Hall element is used as the current sensor.

CITATION LIST

Patent Literatures

[PTL 1] JP-A-2014-006118

SUMMARY OF THE INVENTION

Since magneto-resistive elements such as GMR elements and TMR elements, etc., have high sensitivity, they can measure current without using a magnetic flux concentrating core. By using a current sensor that does not require a magnetic flux concentrating core, the current sensor can be located at a position separated from the bus bars, so that the heat transmitted from a magnetic flux concentrating core and bus bars can be reduced, and the operating life of the current sensor can be made long.

However, since the sensitivity of a magneto-resistive element is high, when such a device is used as a current sensor, the current sensor will readily be affected by magnetic fields generated by currents flowing in bus bars which are neighbors of the bus bar whose current is being measured, so that there is the problem that it is difficult to achieve high accuracy in measuring the value of the current.

In view of the above background, the present invention has a main objective of providing a current sensor-equipped bus bar module which is capable of preventing temperature rise of the current sensor and measuring bus bar current with high accuracy.

According to a first aspect of the present disclosure, a current sensor-equipped bus bar module is characterized in that the module includes: a plurality of bus bars in which currents flow; a current sensor which measures a value of current in at least a part of the plurality of bus bars; and a shield plate which shields magnetic fields generated around the bus bars. In the module, the current sensor includes a magneto-resistive element, and measures the value of current in a bus bar by detecting a strength of the magnetic field which is generated around the bus bar by the flow of the current in the bus bar; the plurality of bus bars are arrayed along a width direction that is at right angles to an extension direction of the bus bars and to a thickness direction of the bus bars; the current sensor is disposed adjacent to the bus bars in the thickness direction, and spaced apart from the bus bars; and the current sensor and the bus bars are covered from both sides, in the thickness direction, by the shield plate.

Furthermore, according to a second aspect of the present disclosure, a current sensor-equipped bus bar module is characterized in that the module includes: a plurality of bus bars in which currents flow; a sealing member which seals the plurality of bus bars to form an integral body; and a current sensor which measures a value of current in at least a part of the plurality of bus bars. In the module, the current sensor includes a magneto-resistive element, and measures the value of current in a bus bar by detecting a strength of the magnetic field generated around the bus bar by the flow of the current in the bus bar; the plurality of bus bars are arrayed along a width direction that is at right angles to an extension direction of the bus bars and to a thickness direction of the bus bars; the current sensor is disposed adjacent to the bus bars in the thickness direction, and spaced apart from the bus bars; and at least a pair of shield plates are provided, which are positioned sandwiching the current sensor and the bus bars in the thickness direction to shield the magnetic field.

According to the first and second aspects of the current sensor-equipped bus bar module, a current sensor is configured as a magneto-resistive element. Since the sensitivity of a magneto-resistive element is high, it is unnecessary to use a magnetic flux concentrating core. This prevents the conventional problems of heat being generated due to eddy currents flowing in the magnetic flux concentrating core, and of the heat being transmitted to the current sensor.

Furthermore, since the current sensor of the current sensor-equipped bus bar module can be disposed separated from the bus bars, resistive heat in the bus bars is prevented from being transmitted to the current sensor. Since a current sensor using a magneto-resistive element has high sensitivity, the magnetic field of a bus bar can be detected if the current sensor is spaced apart from the bus bar.

In that way, the current sensor-equipped bus bar module can suppress the transmission of heat from a magnetic flux concentrating core or a bus bar to the current sensor. As a result, the problem of temperature rise and shortening of the operating life of the current sensor can be prevented.

Furthermore, with the above current sensor-equipped bus bar module, a plurality of bus bars are arrayed along the width direction. Also, a current sensor is arranged at a position adjacent to a bus bar in the thickness direction (see FIG. 1). For that reason, the current sensor is no longer disposed between a pair of bus bars, but can be disposed at a position with sufficient separation from neighboring bus bars. Hence, a current sensor will not be readily affected by the magnetic fields generated by neighboring bus bars.

Furthermore, if a magnetic field that is generated by a neighboring bus bar is transmitted towards a current sensor, the magnetic field can be shielded by the shield plates. Hence, the effects of magnetic fields on the current sensor, which are generated by neighboring bus bars can be reduced, and the value of current in a bus bar can be accurately measured by using the current sensor.

Furthermore, according to the second aspect, the current sensor and the bus bars are interposed between a pair of shield plates, in the thickness direction.

That is to say, the pair of shield plates are disposed separately, such as not to be linked to one another. As described hereinafter, the pair of shield plates may be linked together, but in that case problems would arise, such as the amount of metal required to form the shield plates would become large so that the manufacturing costs of the current sensor-equipped bus bar module would be increased, and the weight would become high. However, if a pair of shield plates are provided, such a problem is unlikely to arise.

As described above, the present disclosure provides a current sensor-equipped bus bar module whereby temperature increase of the current sensor can be suppressed, and whereby the value of current flowing in a bus bar can be accurately measured.

DESCRIPTION OF THE EMBODIMENTS

The current sensor-equipped bus bar module can be used for an electric power converter which performs conversion between DC electric power and AC electric power.

First Embodiment

Figure 1:
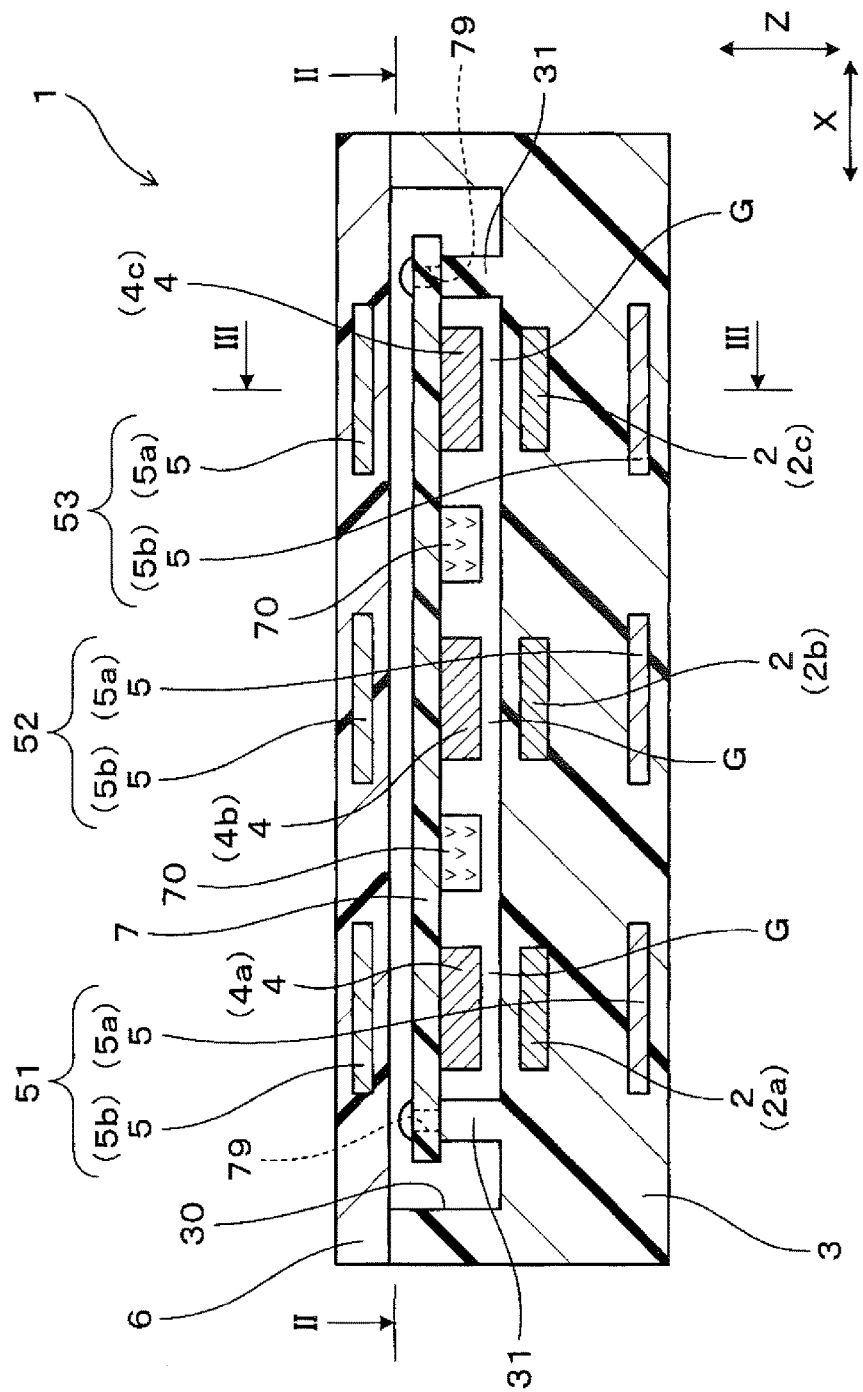
FIG. 1 is a cross-sectional view of a current sensor-equipped bus bar module according to a first embodiment, taken in a plane I-I indicated in FIG. 2.
Figure 2:
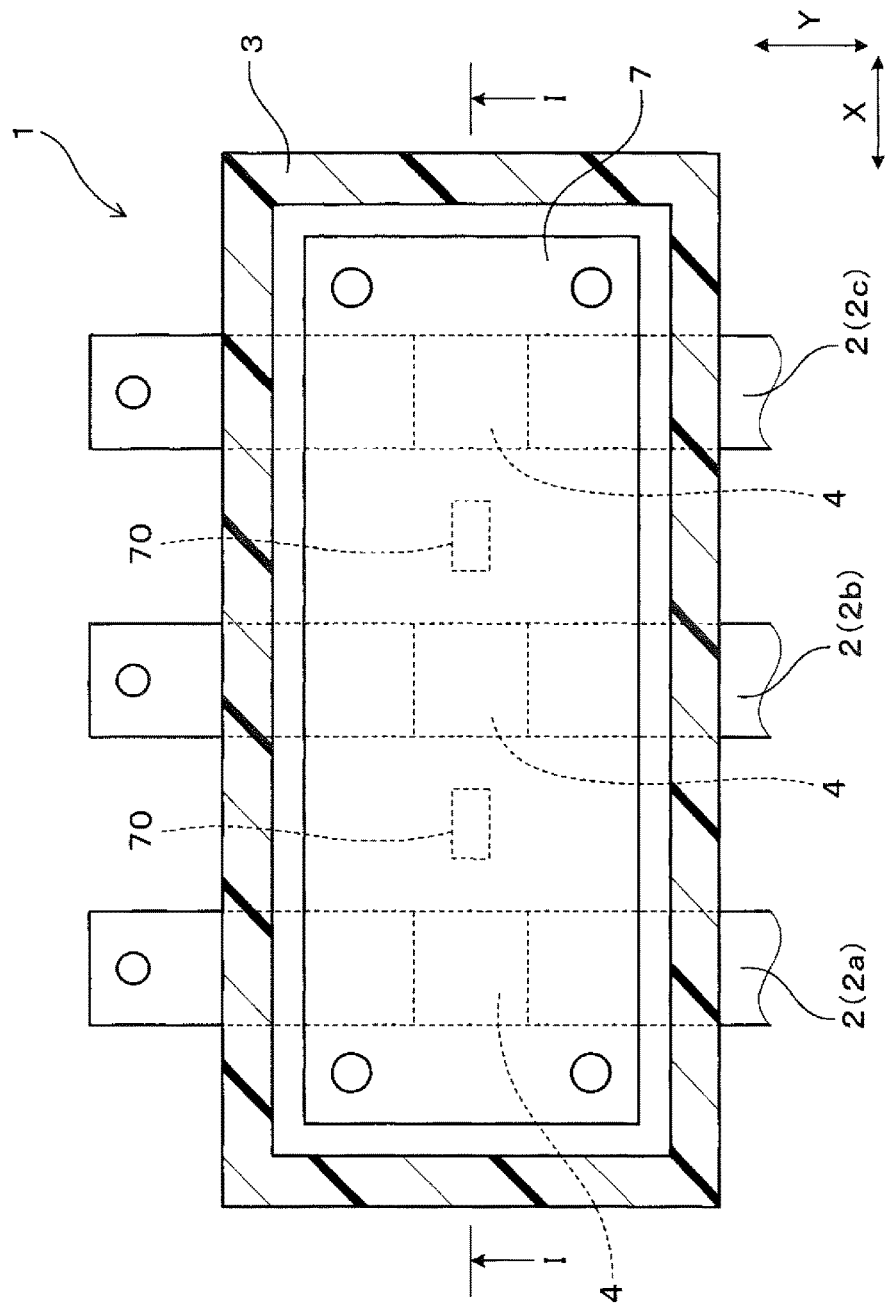
FIG. 2 is a cross-sectional view taken in a plane II-II indicated in FIG. 1.
Figure 3:
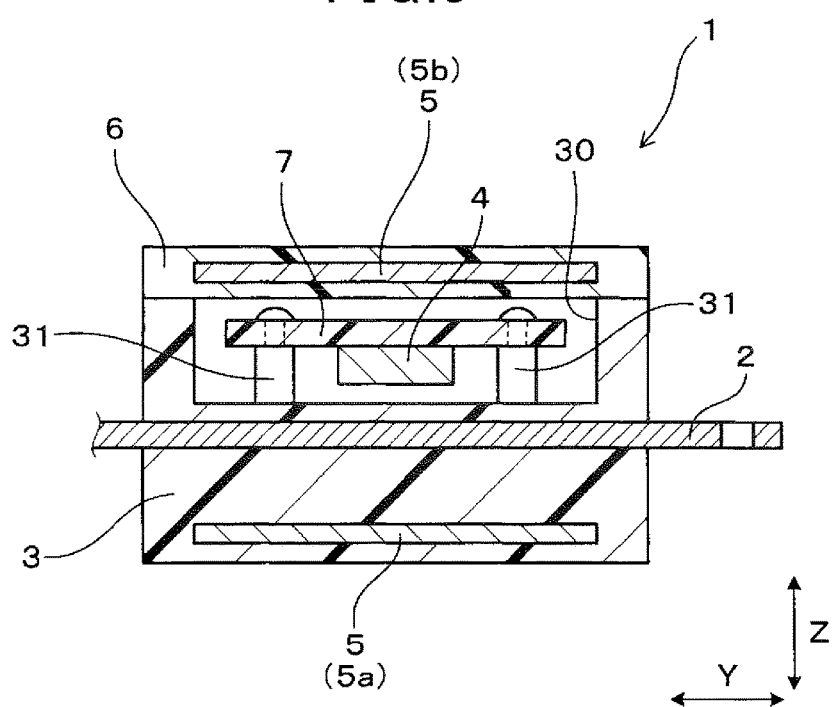
FIG. 3 is a cross-sectional view taken in a plane indicated in FIG. 1.

A first embodiment of the current sensor-equipped bus bar module 1 will be described referring to FIGS. 1 to 8. As shown in FIGS. 1 to 3, the current sensor-equipped bus bar module 1 of the present embodiment includes a plurality of bus bars 2 (2a, 2b and 2c) in which currents flow, current sensors 4 (4a to 4c), and shield plates 5. Each of the current sensors 4 measures the value of current in at least a part of the plurality of bus bars 2 (2a to 2c). The shield plates 5 shield the magnetic fields that are generated around the bus bars 2.

The current sensors 4 (4a to 4c) are each provided with a magneto-resistive element, and detects the intensity of the magnetic field generated around the bus bar 2 when current flows therethrough.

The bus bars 2 (2a to 2c) are arrayed along a width direction (X direction) that is at right angles to both the thickness direction (Z direction) and the extension direction (Y direction) of the bus bars 2.

The current sensors 4 are spaced apart from the respective bus bars 2 and arranged at positions adjacent to the respective bus bars 2 in the Z direction.

The bus bars 2 and the current sensors 4 are covered from both sides in the Z direction, by the shield plates 5. With the present embodiment, the shield plates extend over a wider range than that of the bus bars 2, while overlapping with the respective current sensors 4, as viewed from the Z direction.

Figure 5:
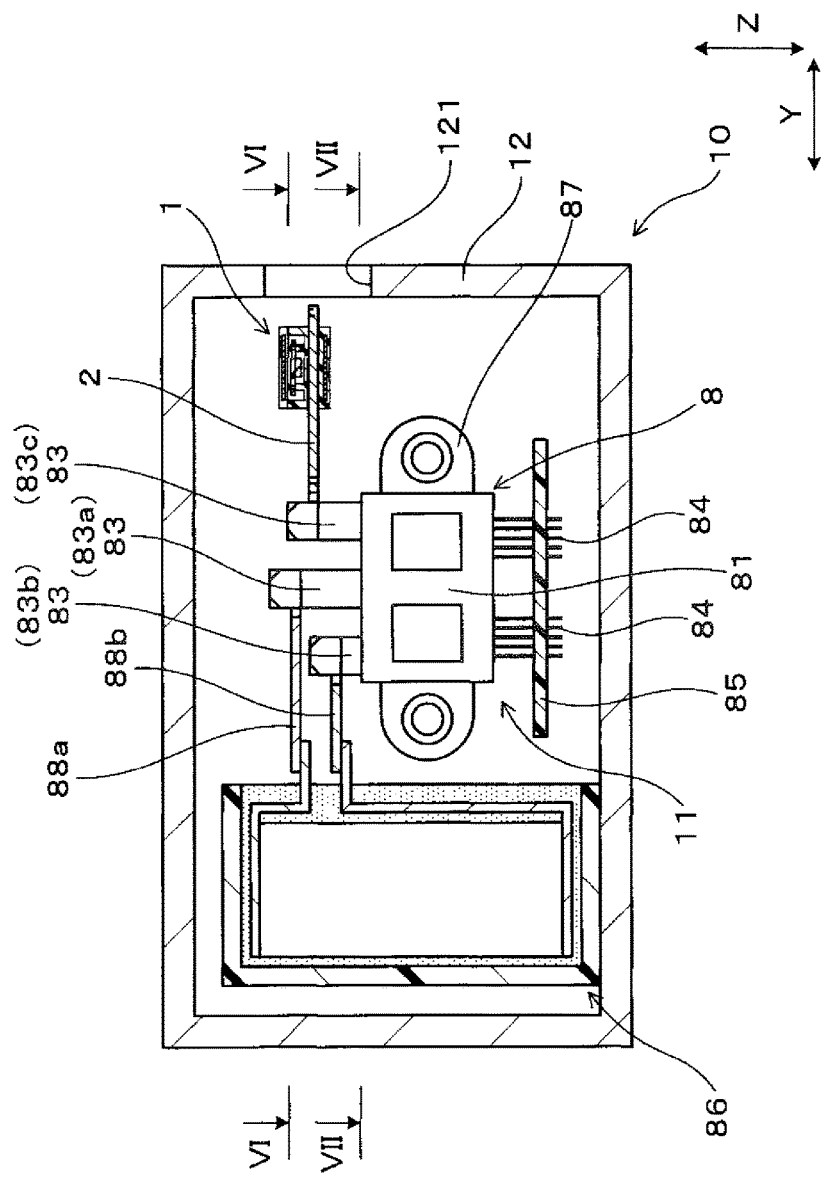
FIG. 5 is a cross-sectional view of an electric power converter according to the first embodiment, the view taken in a plane V-V indicated in FIG. 6.
Figure 6:
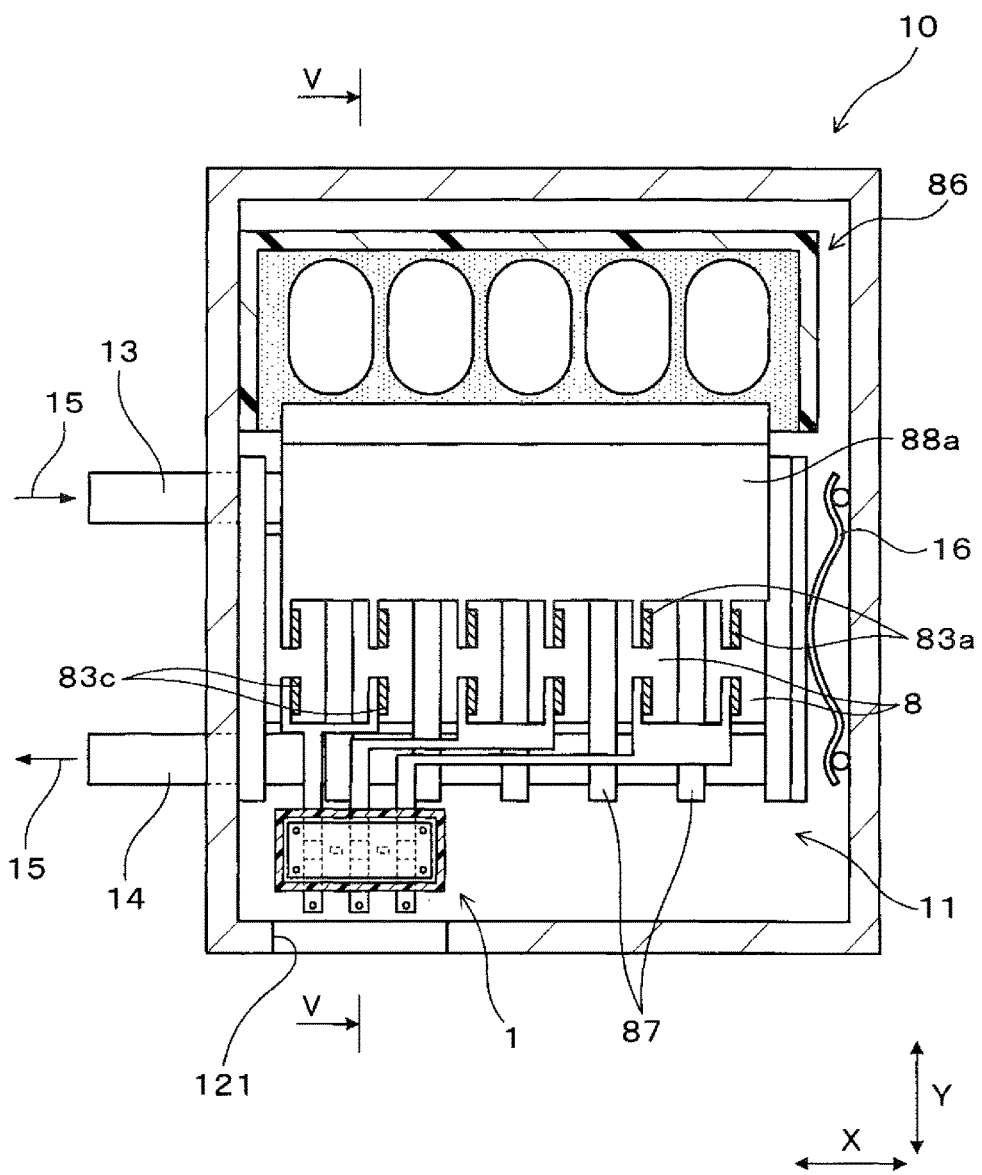
FIG. 6 is a cross-sectional view taken in a plane VI-VI indicated in FIG. 5.

As shown in FIGS. 5 and 6, the current sensor-equipped bus bar module 1 of the present embodiment is used for an electric power converter 10 that performs power conversion between DC power and AC power. The electric power converter 10 is an in-vehicle power conversion device, which is installed on a vehicle, such as a hybrid automobile or electric automobile.

The current sensor-equipped bus bar module 1 of the present embodiment is provided with a sealing member 3 which seals the plurality of bus bars 2 to form an integral body. In addition, with the present embodiment, each of the bus bars 2 is provided with a current sensor 4. Each bus bar 2 and the corresponding current sensor 4 are sandwiched from both sides in the Z direction, by a pair of the shield plates 5 (5a and 5b). With the present embodiment, the sealing member 3 is formed from a non-magnetic resin material.

As shown in FIG. 1, a portion of the sealing member 3 is interposed between each current sensor 4 and the corresponding bus bar 2. A gap G is formed between each current sensor 4 and the corresponding sealing member 3. The current sensors 4 of the present embodiment are each made up of a magneto-resistive element, such as a GMR (giant magneto-resistive) element or a TMR (tunnel magneto-resistive) element.

The current sensors 4 are mounted to a sensor circuit board 7. The sealing member 3 is formed with pillar portions 31. The tip part of each pillar portion 31 is inserted into a through hole 79 that is formed in the sensor circuit board 7, and is thermally caulked. The sensor circuit board 7 is thereby fixedly attached to the pillar portions 31.

Electronic components 70 other than the current sensors 4 are mounted to the sensor circuit board 7. The electronic components 70 are interposed between the circuit substrate 7 and the sealing member 3. The electronic components 70 can each, for example, be a bypass capacitor of a filter circuit.

Furthermore, a recess 30 is formed in the sealing member 3.

The sensor circuit board 7, the current sensors 4 and the electronic components 70 are contained within the recess 30. A lid 6 is attached to the sealing member 3, for covering the opening of the recess 30. The current sensors 4, etc., are thereby enclosed and sealed within the recess 30.

One shield plate (5a) of each pair of shield plates 5 (5a and 5b) is sealed in the sealing member 3. The other shield plate (5b) of the pair is sealed in the lid 6.

With the present embodiment, the three bus bars of the first bus bar 2a, the second bus bar 2b, and the third bus bar 2c are sealed by the sealing member 3. The first current sensor 4a is disposed at a position adjacent to the first bus bar 2a in the Z direction, and the second current sensor 4b is disposed at a position adjacent to the second bus bar 2b in the Z direction. In addition, the third current sensor 4c is disposed at a position adjacent to the third bus bar 2c in the Z direction. The three current sensors 4a to 4c are disposed such that the direction for detecting a magnetic field (magnetic sensing direction) coincides with the X direction.

The first bus bar 2a and the first current sensor 4a are interposed between a first pair of shield plates 51, and the second bus bar 2b and the second current sensor 4b are interposed between a second pair of shield plates 52. In addition, the third bus bar 2c and third current sensor 4c are interposed between a third pair of shield plates 53.

Figure 4:
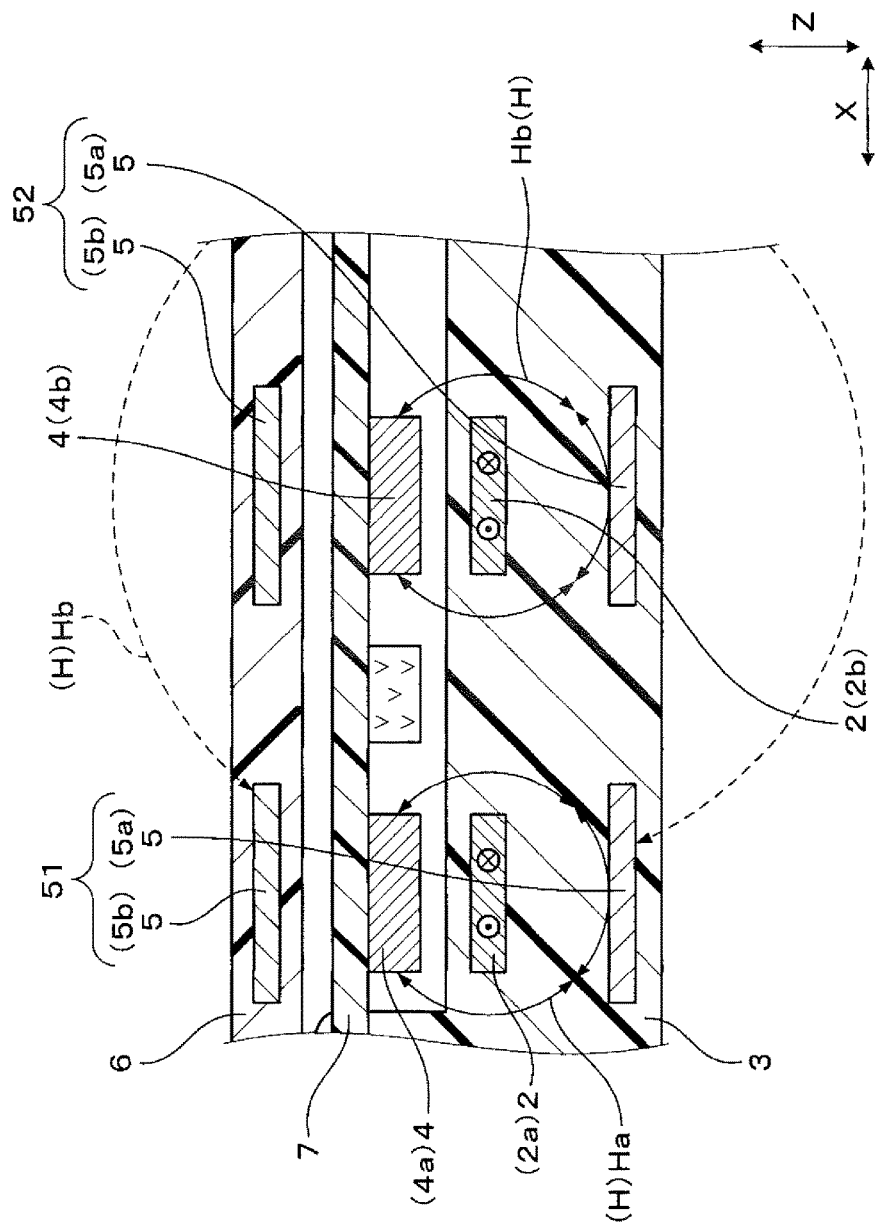
FIG. 4 shows an enlarged major part of FIG. 1.

As shown in FIG. 4, when alternating current flows through the first bus bar 2a, a magnetic field Ha is generated around the first bus bar 2a. The first current sensor 4a measures the intensity of the magnetic field Ha. Similarly, the magnetic field generated around the second bus bar 2b is measured by the second current sensor 4b, and the magnetic field generated around the third bus bar 2c is measured by the third current sensor 4c.

The sensor circuit board 7 is connected to a control circuit board 85, described hereinafter, of the power converter 10 (see FIG. 5). The sensor circuit board 7 transmits the measured value of current of each of the bus bars 2 (2a to 2c) to the control circuit board 85. The control circuit board 85 feeds back the measured values, for use in operation control, etc., of the power conversion device 10.

As shown in FIG. 4, the first bus bar 2a and the first current sensor 4a are covered from both sides in the Z direction, by a pair of shield plates 5a and 5b (first shield plate pair 51). The second bus bar 2b and the third bus bar 2c are also similarly configured. The shield plates 5a and 5b shield the magnetic field H generated from the bus bars 2, such as not to leak out excessively to the exterior. However, in some cases, the magnetic field H is not necessarily completely shielded by the shield plates 5a and 5b. For example, a part of a magnetic field Hb generated by the second bus bar 2b (magnetic field Hb') may leak from the second pair of shield plates 52. In that case, the magnetic field Hb' is shielded by the first pair of shield plates 51, so that the first current sensor 4a is not greatly affected by the magnetic field Hb'.

Similarly, since the second current sensor 4b is interposed between the second shield plate pair 52, if there is a leakage of the magnetic fields from the neighboring bus bars 2 (the first and third bus bars 2a and 2c), the magnetic field will be shielded by the second shield plate pair 52. Thus, the second current sensor 4b will not be greatly affected by the magnetic fields from these neighboring bus bars 2. This is similarly true for the third current sensor 4c.

The configuration of the power converter 10 will now be described. As shown in FIGS. 5 and 6, the power converter 10 of the present embodiment includes a plurality of semiconductor modules 8, and a plurality of cooling tubes 87 for cooling the semiconductor modules 8. The semiconductor modules 8 and cooling tubes 87 are alternately layered, to constitute a layered unit 11.

Each semiconductor module 8 includes a main body 81 which incorporates semiconductor devices 82 (see FIG. 8), power terminals 83 which project from the main body 81, and control terminals 84. The power terminals 83 include a positive terminal 83a and a negative terminal 83b to which a DC voltage is applied, and an AC terminal 83c which is connected to an AC load 892 (see FIG. 8). The bus bars 2 of the present embodiment are connected to the AC terminals 83c. The case 12 of the power converter 10 is formed with a connector insertion hole 121 for inserting a connector, not shown. When the connector is inserted into the insertion hole 121 for connection to the bus bars 2, the bus bars 2 are ensured to be electrically connected to the AC load 892.

The positive terminal 83a and the negative terminal 83b are connected to a capacitor 86 via a positive-side metal plate 88a and a negative-side metal plate 88b, respectively. The control terminals 84 are connected to the control circuit board 85. The control circuit board 85 controls on-off operation of each semiconductor module 8. Thus, the DC voltage applied across the positive terminal 83a and the negative terminal 83b of the semiconductor module is converted to an AC voltage, which is outputted from the bus bars 2 (2a to 2c).

The control circuit board 85 is connected by a connecting lead, not shown, to the sensor circuit board 7 (see FIG. 1) in the current sensor-equipped bus bar module 1. As described above, the sensor circuit board 7 transmits measured values of the current flowing in each of the bus bars 2 (2*a* to 2*c*) to the control circuit board 85. The control circuit board 85 uses the measured values, for feedback control of the semiconductor modules 8, etc.

Figure 7:
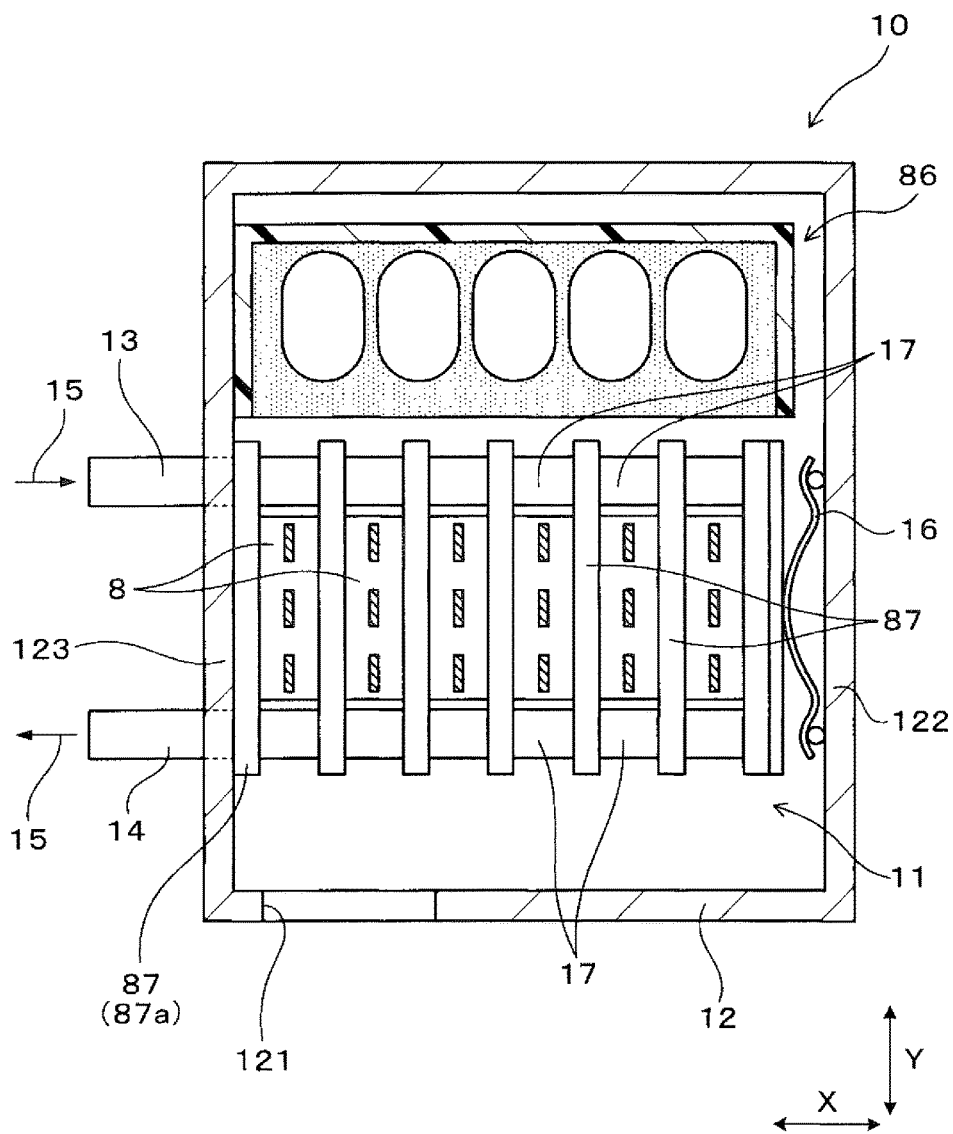
FIG. 7 is a cross-sectional view taken in a plane VII-VII indicated in FIG. 5.

As shown in FIG. 7, two cooling tubes 87 which are adjacent in the X direction are connected at both ends in the Y direction, by connecting tubes 17. Furthermore, a cooling tube 87*a*, which is positioned at an end of the plurality of cooling tubes 87 in the X direction, is connected to an intake tube 13 for introducing a coolant 15 and to a discharge tube 14 for discharging the coolant 15. The coolant 15 which passes into the intake tube 13 flows through the connecting tubes 17 and through all of the cooling tubes 87, and then is discharged through the discharge tube 14. In that way, the individual semiconductor modules 8 are ensured to be cooled.

Further, the layered unit 11 is interposed between a pair of walls 122 and 123 of the case 12. A presser member 16 (leaf spring) is interposed between one wall 122 and the layered unit 11. The presser member 16 pushes the layered unit 11 in the X direction, thereby retaining the layered unit 11 pressed against the other wall 123 of the casing 12. This maintains contact pressure of the semiconductor modules 8 with the cooling tubes 87, securing the layered unit 11 within the case 12.

Figure 8:
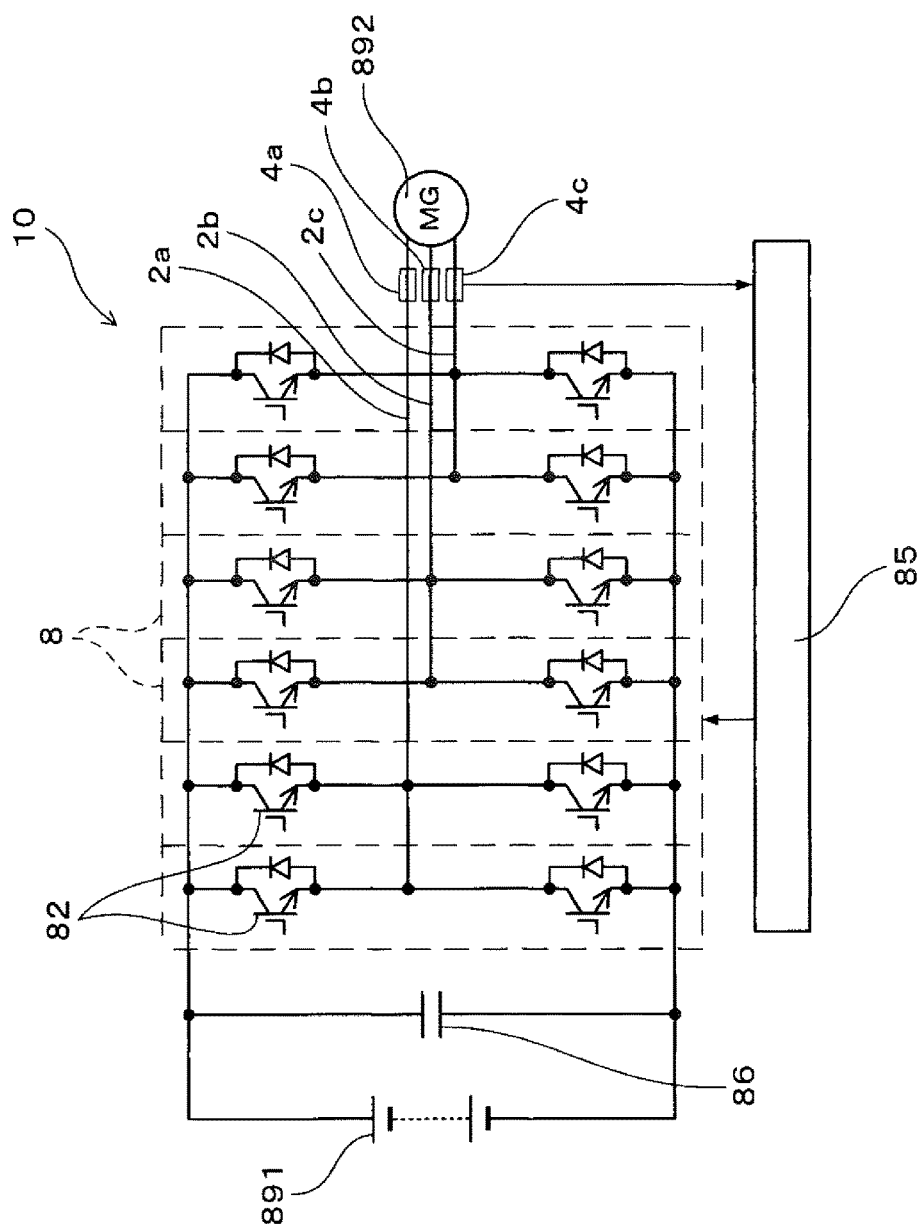
FIG. 8 is a circuit diagram of the power converter according to the first embodiment.

The electrical circuit of the power converter 10 will now be described. With this example, as shown in FIG. 8, a plurality of semiconductor elements 82 (IGBT elements) incorporated in the semiconductor modules 8 are used to form an inverter circuit. The DC power supplied from the DC power supply 891 is converted to AC power by on/off switching of each of the semiconductor devices 82. The converted AC power is used to drive the AC load 892 (three-phase AC motor). The vehicle is thereby driven.

Advantageous effects of the present embodiment will now be described. As described above, magneto-resistive elements are used to form the current sensors 4 of the embodiment. Since magneto-resistive elements have high sensitivity, it is not necessary to provide a magnetic flux concentrating core. This eliminates the conventional problem of causing eddy current to flow through a magnetic flux concentrating core, and of transmitting the heat to the current sensors 4.

Further, with the present embodiment, as shown in FIG. 1, the current sensors 4 are disposed at positions spaced apart from the bus bars 2. This eliminates the problem of resistive heat of the bus bars 2 being transmitted to the current sensors 4. The current sensors 4, which use magneto-resistive elements to exert high sensitivity, can detect the magnetic fields of the bus bars 2 if spaced apart from the bus bars 2.

Thus, with the present embodiment, heat transfer from the magnetic flux concentrating cores or the bus bars 2 to the current sensors 4 can be prevented. As a result, the problem of temperature increase and shortening of the operating life of the current sensor can be avoided.

Figure 20:
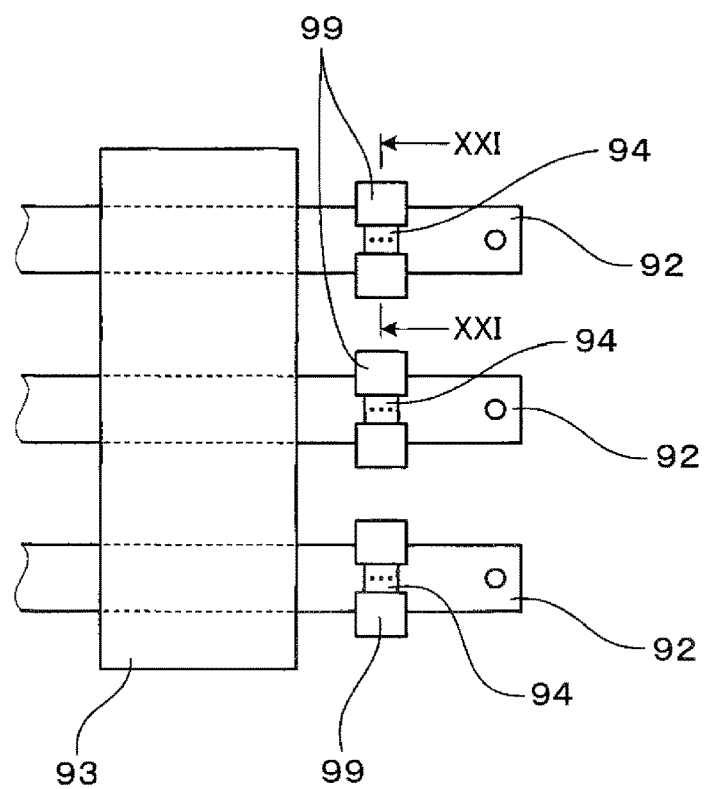
FIG. 20 is a conceptual diagram of current sensors and bus bars of a third comparison example.
Figure 21:
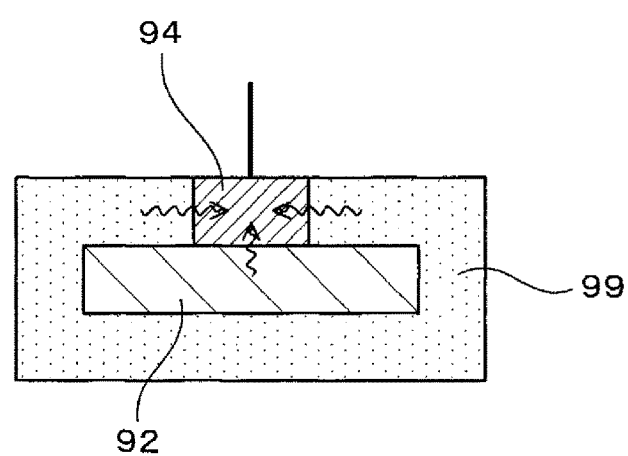
FIG. 21 is a cross-sectional view taken in a plane XXI-XXI indicated in FIG. 20.

That is, as shown in FIGS. 20 and 21, when each current sensor 94 uses a Hall element as in the conventional art, it is necessary to provide a magnetic flux concentrating core 99, because Hall elements have low sensitivity to magnetic fields. Hence, due to the effect of the AC magnetic field generated around a bus bar 92, eddy current flows in the magnetic flux concentrating core 99. The magnetic flux concentrating core 99 may be thereby heated by the eddy current, and the heat may be transferred to the current sensor 94. Also, for the reasons of size reduction and sensitivity enhancement of the magnetic flux concentrating core 99, the Hall element is disposed in contact with the bus bar in many cases. Therefore, resistive heat generated in the bus bar 92 is likely to be transmitted to the Hall element (current sensor).

Thus, in the case of the current sensor 94 which uses a Hall element, heat is readily transmitted from the bus bar 92 and the magnetic flux concentrating core 99, so that the temperature tends to rise. For this reason, the operating life of the current sensor 94 tends to be lowered. However, since the current sensor 4 using a magneto-resistive element as in the above embodiment can dispense with a magnetic flux concentrating core, heat is prevented from being transmitted from the magnetic flux concentrating core to the current sensor 4. Furthermore, since the sensitivity of the current sensor 4 using a magneto-resistive element is high, the magnetic field of the bus bar 2 can be detected if the current sensor 4 is spaced apart from the bus bar 2. By separating the current sensor 4 from the bus bar 2, heat of the bus bar 2 is prevented from being transmitted to the current sensor 4 to increase temperature.

Furthermore, with the present embodiment, as shown in FIG. 1, the plurality of bus bars 2 are arrayed along the X direction. Each current sensor 4 is disposed at a position adjacent to the corresponding bus bar 2 in the Z direction. Hence, no current sensor 4 is located between two bus bars 2, and each current sensor 4 can be disposed at a position with sufficient separation from neighboring bus bars 2. Thus, each current sensor 4 is less susceptible to the effects of magnetic fields generated from neighboring bus bars 2.

Figure 18:
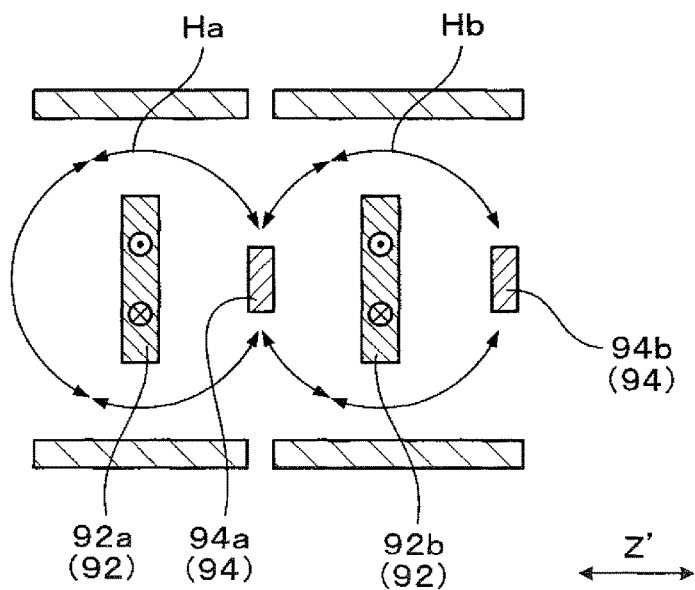
FIG. 18 is a conceptual diagram of current sensors and bus bars of a first comparison example.

Specifically, let us take an example, as shown in FIG. 18, where a plurality of bus bars 92 are arrayed along the thickness direction (Z' direction) of the bus bars 92, with the current sensors 94 being disposed at positions close to neighboring bus bars 92 in the Z' direction. In this case, since each current sensor 94 is close to neighboring bus bars 92, the current sensor 94 has a risk of being affected by the magnetic fields of these neighboring bus bars 92, disabling accurate measurement of the electric current values.

Figure 19:
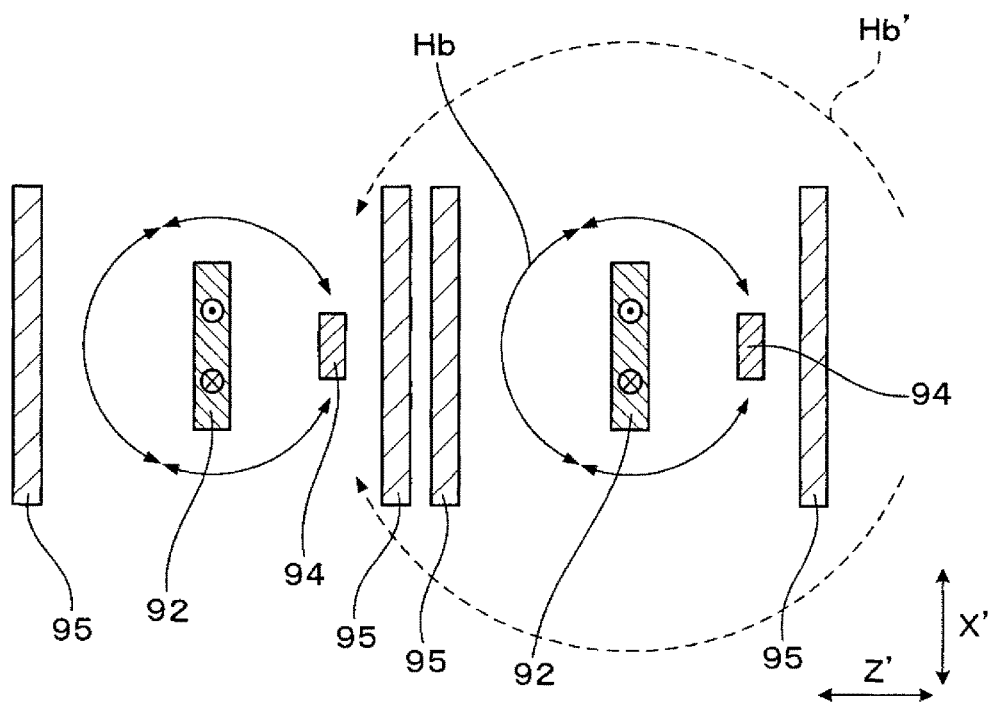
FIG. 19 is a conceptual diagram of current sensors and bus bars of a second comparison example.

Furthermore, if each current sensor 94 is disposed between a bus bar 92 and a shield plate 95 as shown in FIG. 19, the current sensor 94 will be affected by the magnetic field Hb' of a neighboring bus bar 92, disabling accurate measurement of the electric current values.

In contrast, with the present embodiment, as shown in FIG. 1, if the plurality of bus bars 2 are arrayed along the width direction (X direction), and the current sensors 4 are disposed at positions adjacent to the bus bars 2 in the thickness direction (Z direction), then the current sensors 4 can be arranged at positions that are sufficiently separated from the neighboring bus bars 2. As a result, the current sensors 4 are less susceptible to magnetic fields generated from the neighboring bus bars 2.

With the present embodiment, the current sensors 4 and the bus bars 2 are covered from both sides in the Z direction, by the shield plates 5 (5*a* and 5*b*). Hence, as shown in FIG. 4, if there is leakage of the magnetic field H generated from neighboring bus bars 2, the magnetic field H is blocked by the shield plates 5*a* and 5*b*. Hence, the effects of the magnetic field H from the neighboring bus bars 2 on a current sensor 4 can be more reduced. Thus, the value of current in a bus bar 2 can be accurately measured by using a current sensor 4.

With the present embodiment, as shown in FIG. 1, a portion of the sealing member 3 is interposed between the current sensors 4 and the respective bus bars 2.

Hence, since the resistive heat generated from the bus bars 2 can be shielded by the sealing member 3, resistive heat is more effectively prevented from being transferred to the current sensors 4. Temperature increase of the current sensors 4 can thus be more effectively minimized.

With the present embodiment, as shown in FIG. 1, a gap G is formed between the current sensors 4 and the sealing member 3. That is to say, contact of the current sensors 4 with the sealing member 3 is ensured to be prevented. Hence, heat generated from the bus bars 2 is prevented from being transmitted to the sealing member 3, and being further transmitted to the current sensors 4. In that way, temperature increase of the current sensors 4 can be more effectively minimized.

With the present embodiment, the bus bars 2 and the current sensors 4 are sandwiched between the pair of shield plates 5 (5a and 5b), in the Z direction.

Figure 15:
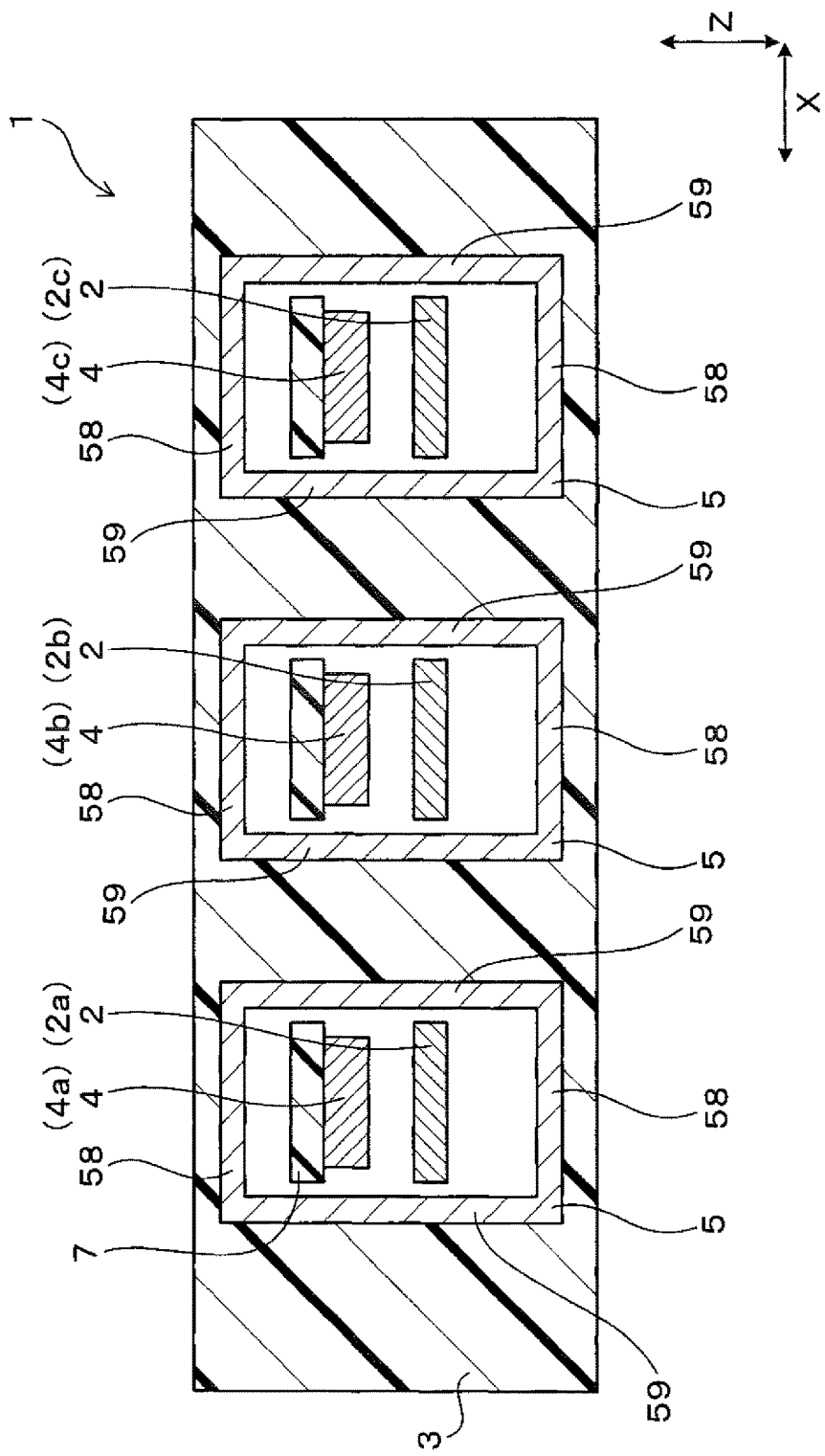
FIG. 15 is a cross-sectional view of a current sensor-equipped bus bar module according to a sixth embodiment.

For that reason, the current sensors 4 are less susceptible to the effects of magnetic fields generated from neighboring bus bars 2. That is, as shown in FIG. 15, a current sensor 4 and a bus bar 2 can be enclosed, in the Z direction, by means of a single shield plate 5. However, in that case, eddy currents would be produced in the shield plate 5 by alternating magnetic fields generated from the bus bar 2, and these eddy currents could flow in a connecting portions 59 of the shield plate 5. For that reason, eddy currents could flow in the vicinity of the current sensor 4, and the neighboring current sensor 4 could be affected by the magnetic fields produced by these eddy currents. However, with the present embodiment, a pair of shield plates 5a and 5b are utilized without forming connecting portions 59, thereby preventing eddy currents from flowing close to the current sensor 4, and preventing magnetic fields produced by the eddy currents from affecting the current sensor 4.

Furthermore, use of a pair of shield plates 5 (5a, 5b), which are not linked, as with the present embodiment can reduce the amount of the metal material forming the shield plates 5. In that way, weight and manufacturing cost of the current sensor-equipped bus bar module can be reduced.

With the present embodiment, as shown in FIG. 1, one shield plate 5a of a pair of shield plates 5a and 5b is sealed in the sealing member 3 and the other shield plate 5b is sealed in the lid 6.

In that way, the lid 6 can be used for covering the opening of the recess 30 and also for securing the other shield plate 5b. Hence, it is not necessary to separately provide a dedicated part for attaching the other shield plate 5b to the sealing member 3, so that the number of required parts can be reduced. Thus, the manufacturing cost of the current sensor-equipped bus bar module 1 can be reduced.

With the present embodiment, as shown in FIG. 1, the electronic components 70 other than the current sensors 4 are interposed between the circuit board 7 and the sealing member 3. Hence, the space between the circuit board 7 and the sealing member 3 can be effectively utilized for accommodating the electronic components 70. Thus, wasted space can be reduced, and the current sensor-equipped bus bar module 1 can readily be made compact in size.

With the present embodiment described above, there is provided a current sensor-equipped bus bar module which is capable of minimizing temperature increase of the current sensors, and accurately measuring values of current in the bus bars.

Second Embodiment

With the following embodiment, unless otherwise indicated, elements identical to constituent elements of the first embodiment are designated by the same symbols as those of the first embodiment.

Figure 9:
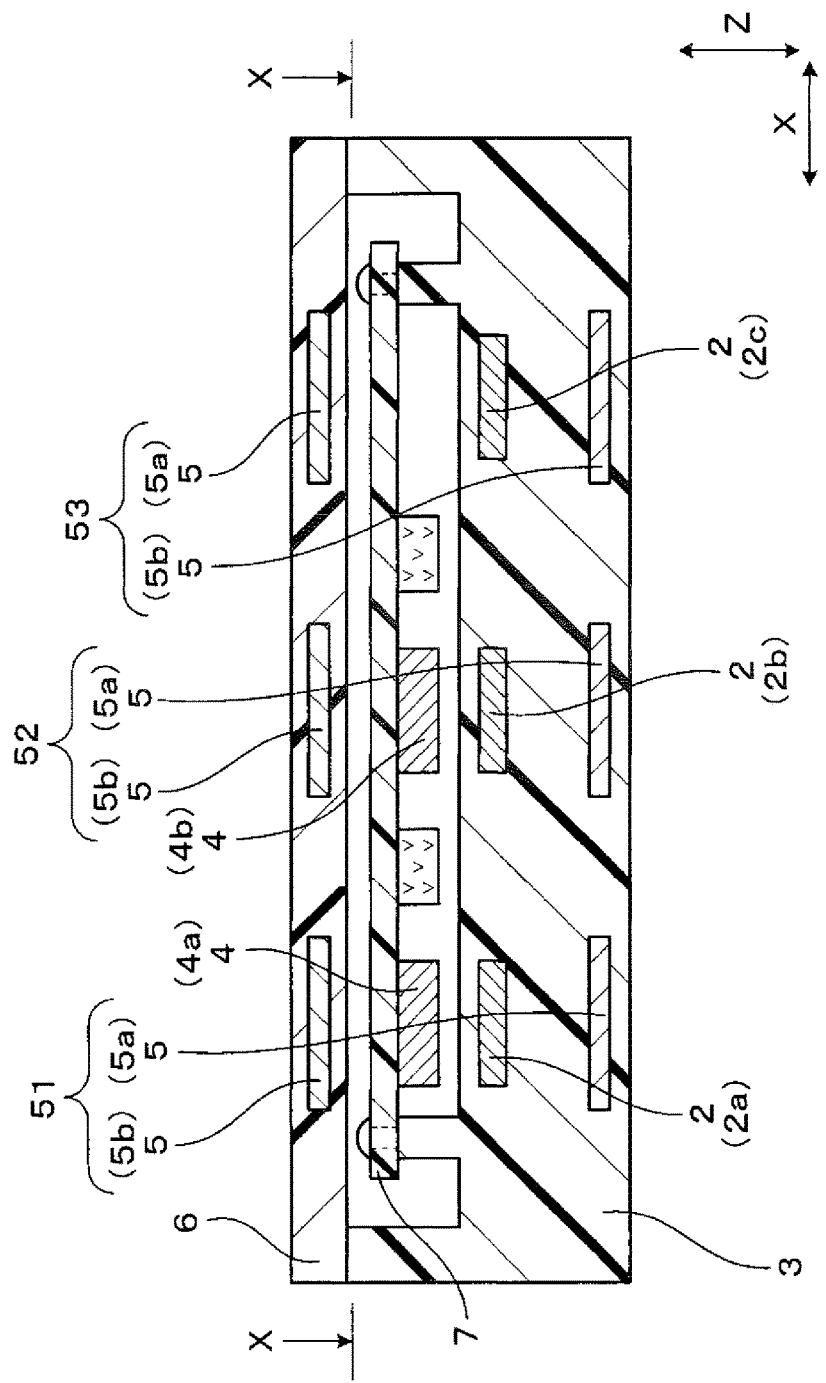
FIG. 9 is a cross-sectional view of a current sensor-equipped bus bar module according to a second embodiment.

With the present embodiment, the mounting positions of the current sensors 4 are changed. With the embodiment, as shown in FIG. 9, of the three bus bars 2a, 2b and 2c, current sensors 4 are provided only for the first bus bar 2a and the second bus bar 2b, and no current sensor 4 is provided for the third bus bar 2c. With the present embodiment, values of current are ensured to be measured only for two bus bars 2 (first and second bus bars 2a and 2b), and the value of current in the third bus bar 2c is ensured to be calculated by using the measured values. Such a calculation is possible since 3-phase currents flow in the three bus bars 2.

Figure 10:
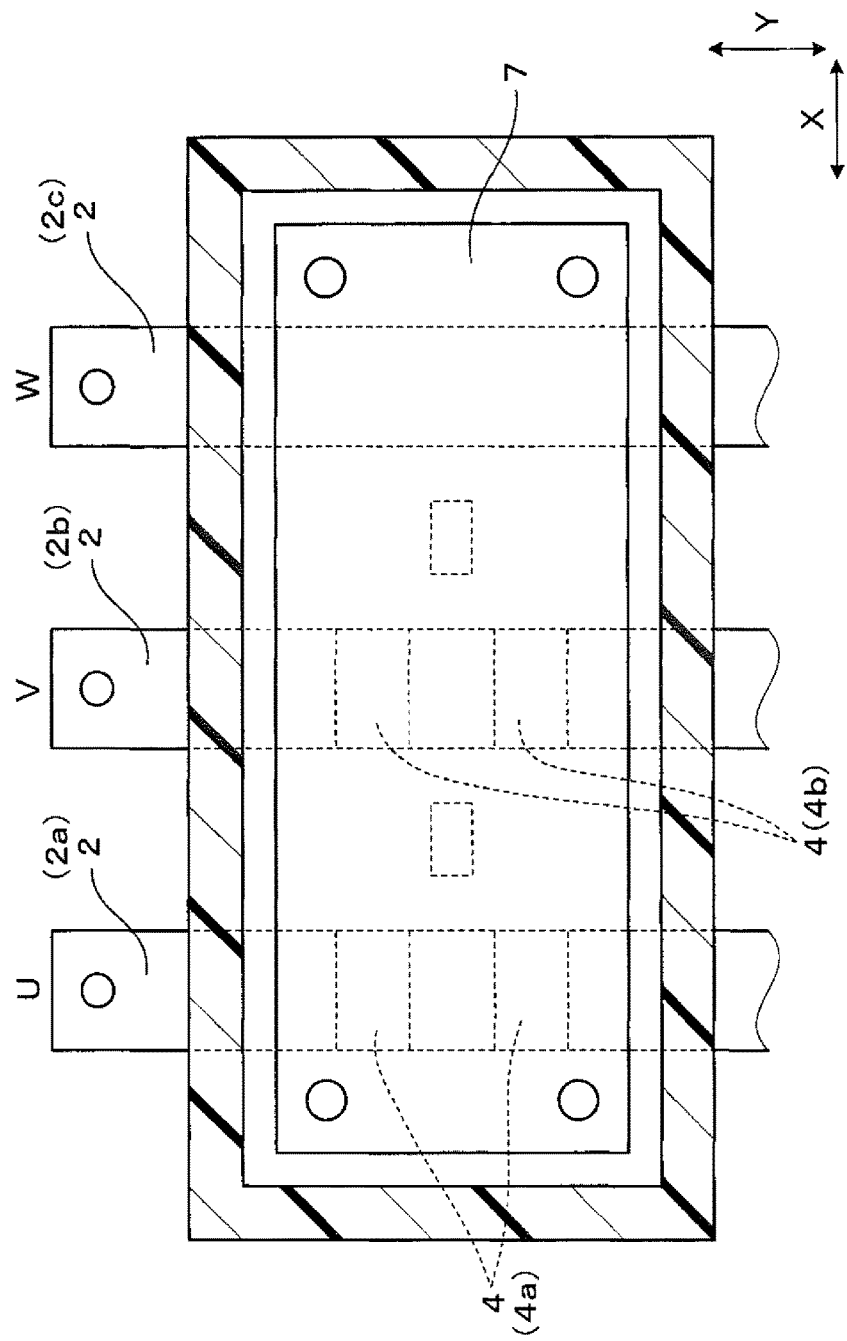
FIG. 10 is a cross-sectional view taken in a plane X-X indicated in FIG. 9.

As shown in FIG. 10, the first bus bar 2a is provided with two first current sensors 4a. Hence, if one of the two first current sensors 4a should fail, the value of current in the first bus bar 2a is ensured to be measured by using the other one of the first current sensors 2a. The second bus bar 2b is similarly provided with two second current sensors 4b.

In other respects, the structure and advantageous effects are the same as those of the first embodiment.

Figure 11:
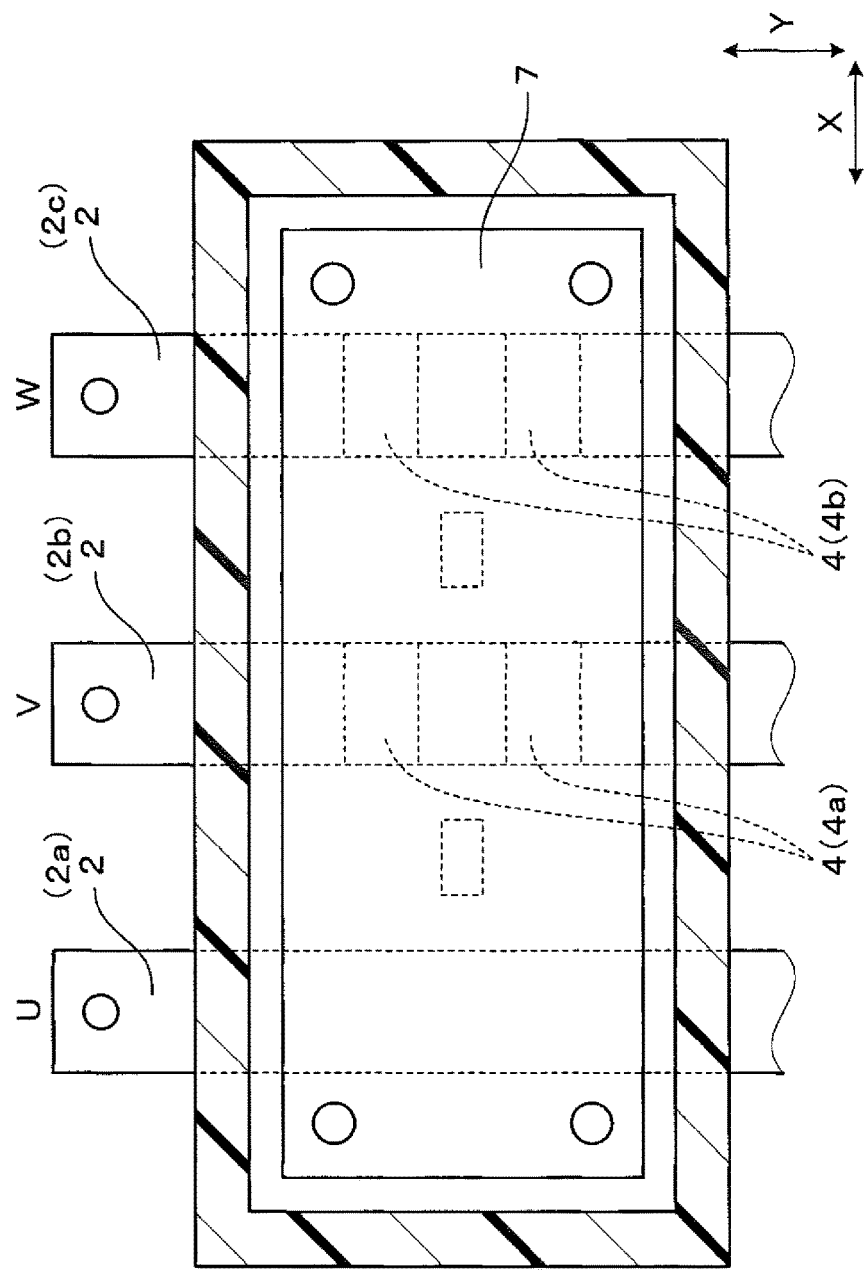
FIG. 11 is a cross-sectional view of a current sensor-equipped bus bar module according to the second embodiment, having a V-phase bus bar and a W-phase bus bar equipped with respective current sensors.

With the present embodiment, as shown in FIG. 10, current sensors 4 are provided for U-phase bus bars 2 (first bus bar 2a), and the V-phase bus bars 2 (second bus bar 2b), however, the present disclosure is not limited to this. That is, as shown in FIG. 11, current sensors 4 may be provided for the V-phase bus bars 2 (second bus bar 2b) and for W-phase bus bars 2 (third bus bar 2c).

Third Embodiment

Figure 12:
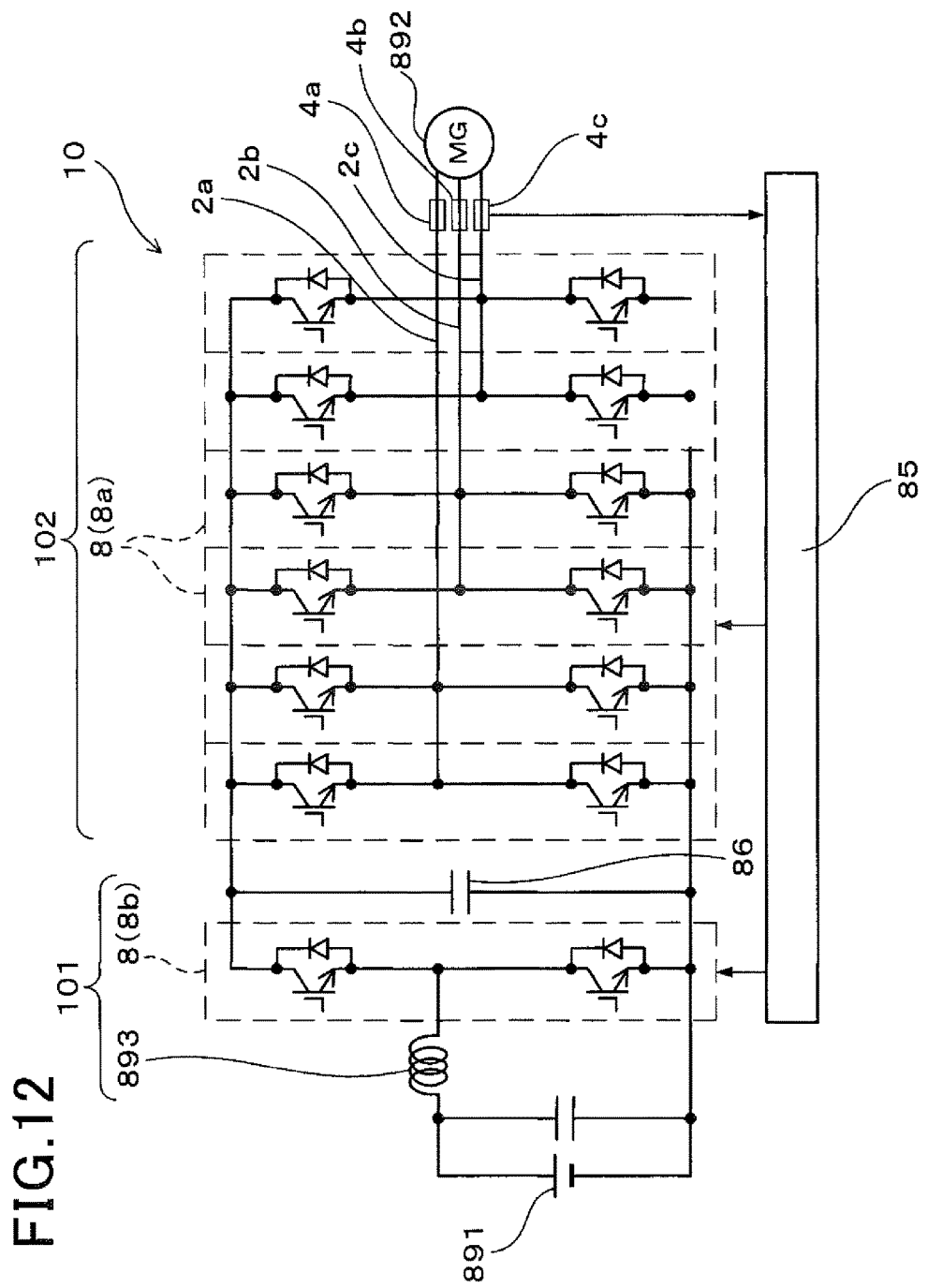
FIG. 12 is a circuit diagram of a power converter according to a third embodiment.

With the present embodiment, the circuit of the power converter 10 is changed. As shown in FIG. 12, the power converter 10 of the present embodiment includes an inductor 893, and a voltage step-up semiconductor module 8b. The inductor 893 and the voltage step-up semiconductor module 8b constitute a voltage step-up circuit 101. In addition, an inverter circuit 102 is constituted by a plurality of inverter semiconductor modules 8a. With the power converter 10 of the present embodiment, the voltage of a DC power source 891 is ensured to be boosted by the voltage step-up circuit 101, followed by conversion of the DC power to AC power by the inverter circuit 102. Current sensors 4 are provided for the bus bars 2 which connect the inverter circuit 102 and the AC load 892.

In other respects, the structure and advantageous effects are the same as those of the first embodiment.

Fourth Embodiment

With the present embodiment, the attachment positions of the current sensors 4 are changed.

Figure 13:
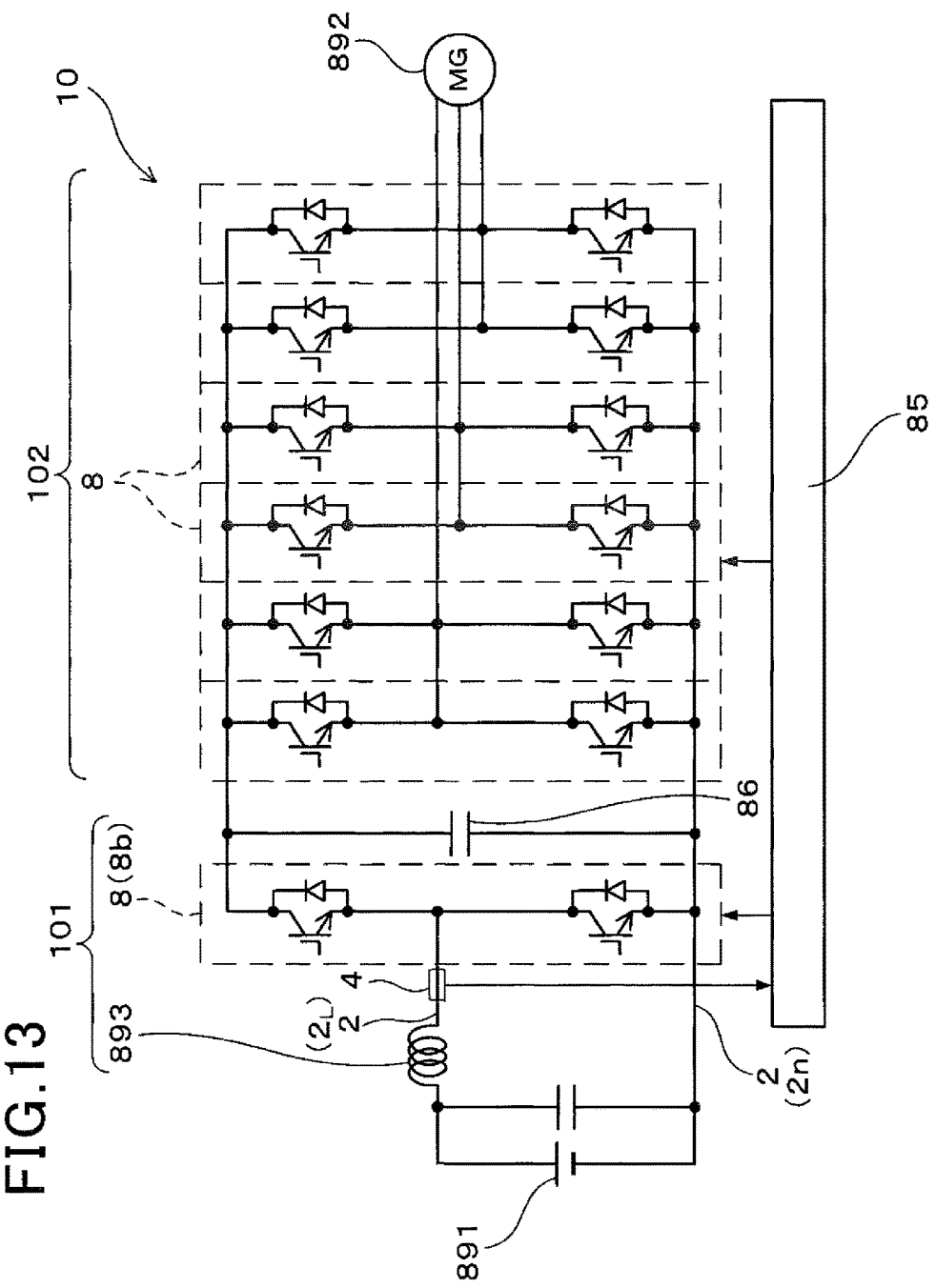
FIG. 13 is a circuit diagram of a power converter according to a fourth embodiment.

As shown in FIG. 13, with the present embodiment, a current sensor 4 is provided to a voltage step-up bus bar $2_L$ which connects the voltage step-up semiconductor module 8b to the inductor 893. The current sensor 4 serves to measure the current flowing through the voltage step-up bus bar $2_L$. The control circuit board 85 is configured to calculate the temperature of the inductor 893 by using the measured values derived from the current sensor 4. When the current flowing through the boost bus bar $2_L$ exceeds a predetermined threshold value, the control circuit board 85 judges that the temperature of the inductor 893 is excessively high, and limits the current.

The negative electrode of the DC power source 891 is connected to the semiconductor modules 8 (8a, 8b) by a negative bus bar 2n. The voltage step-up bus bar $2_L$ and the negative bus bar 2n are disposed neighboring one another along the X direction, in a similar manner to that of the bus bars 2a to 2c of the first embodiment. The voltage step-up bus bar 2$_L$ and the current sensor 4 are ensured to be covered from both sides in the Z direction, by shield plates 5.

In other respects, the structure and advantageous effects are the same as those of the first embodiment.

Fifth Embodiment

Figure 14:
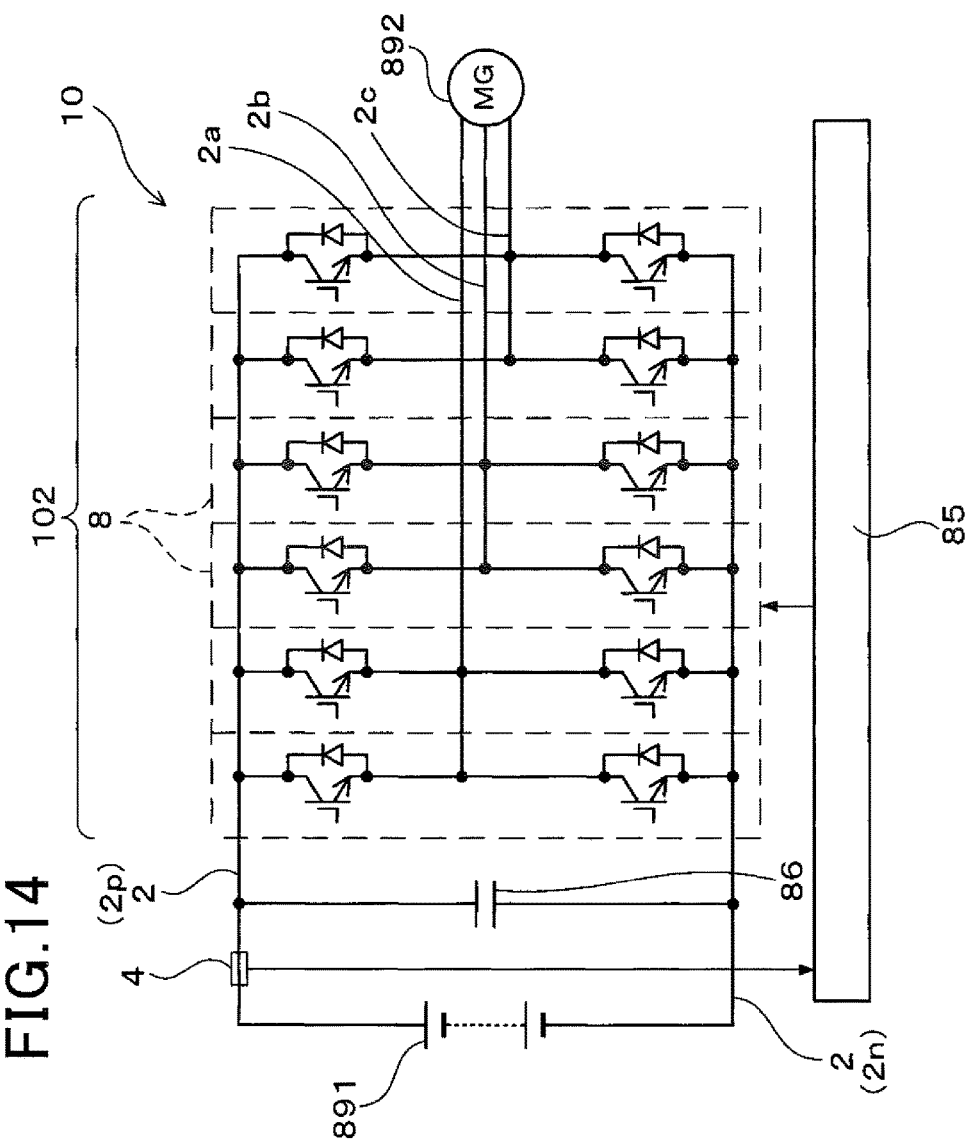
FIG. 14 is a circuit diagram of a power converter according to a fifth embodiment.

With the present embodiment, the attachment position of the current sensor 4 is changed. As shown in FIG. 14, similarly to the first embodiment, the power converter 10 of the present embodiment does not include a voltage step-up circuit, but only the inverter circuit 102. The positive electrode of the DC power source 891 is electrically connected to the semiconductor modules 8 by a positive bus bar 2p. In addition, the negative electrode of the DC power source 891 is electrically connected to the semiconductor modules 8 by a negative bus bar 2n. The capacitor 86 is provided between the positive bus bar 2p and the negative bus bar 2n. A current sensor 4 is installed on the positive bus bar 2p so as to be located within a range in which the positive bus bar 2p connects the DC power supply 891 and the capacitor 86.

With the present embodiment, the positive bus bar 2p and the negative bus bar 2n are arranged to be adjacent in the X direction, similarly to the bus bars 2a to 2c of the first embodiment. The positive bus bar 2p and the current sensor 4 are configured such as to be covered from both sides in the Z direction, by the shield plates 5.

With the present embodiment, the current flowing in the bus bar 2p is measured by the current sensor 4, and the measured values are used by the control circuit board 85 to calculate the temperature of the capacitor 86. If the current flowing in the positive bus bar 2p exceeds a predetermined threshold value, the control circuit board 85 judges that the temperature of the capacitor 86 is excessively high, and limits the current.

In other respects, the structure and advantageous effects are the same as those of the first embodiment.

Sixth Embodiment

With the present embodiment, the shape of the shield plate 5 is changed. As shown in FIG. 15, each shield plate 5 is formed in an annular shape. A bus bar 2, a current sensor 4 and a sensor circuit board 7 are disposed within the annular shield plate 5.

Each shield plate 5 includes two main plate portions 58, and two connecting portions 59. The connecting portions 59 connect the two main plate portions 58 to each other. The bus bar 2 and the current sensor 4 are covered from both sides in the Z direction, by the two main plate portions 58.

The advantageous effects of the present embodiment are as follows. With the above configuration, the bus bar 2 and the current sensor 4 are surrounded on four sides by the annular shield plate 5. Accordingly, the magnetic field generated from the bus bar 2 can be shielded more effectively.

In other respects, the structure and advantageous effects are the same as those of the first embodiment.

Seventh Embodiment

Figure 16:
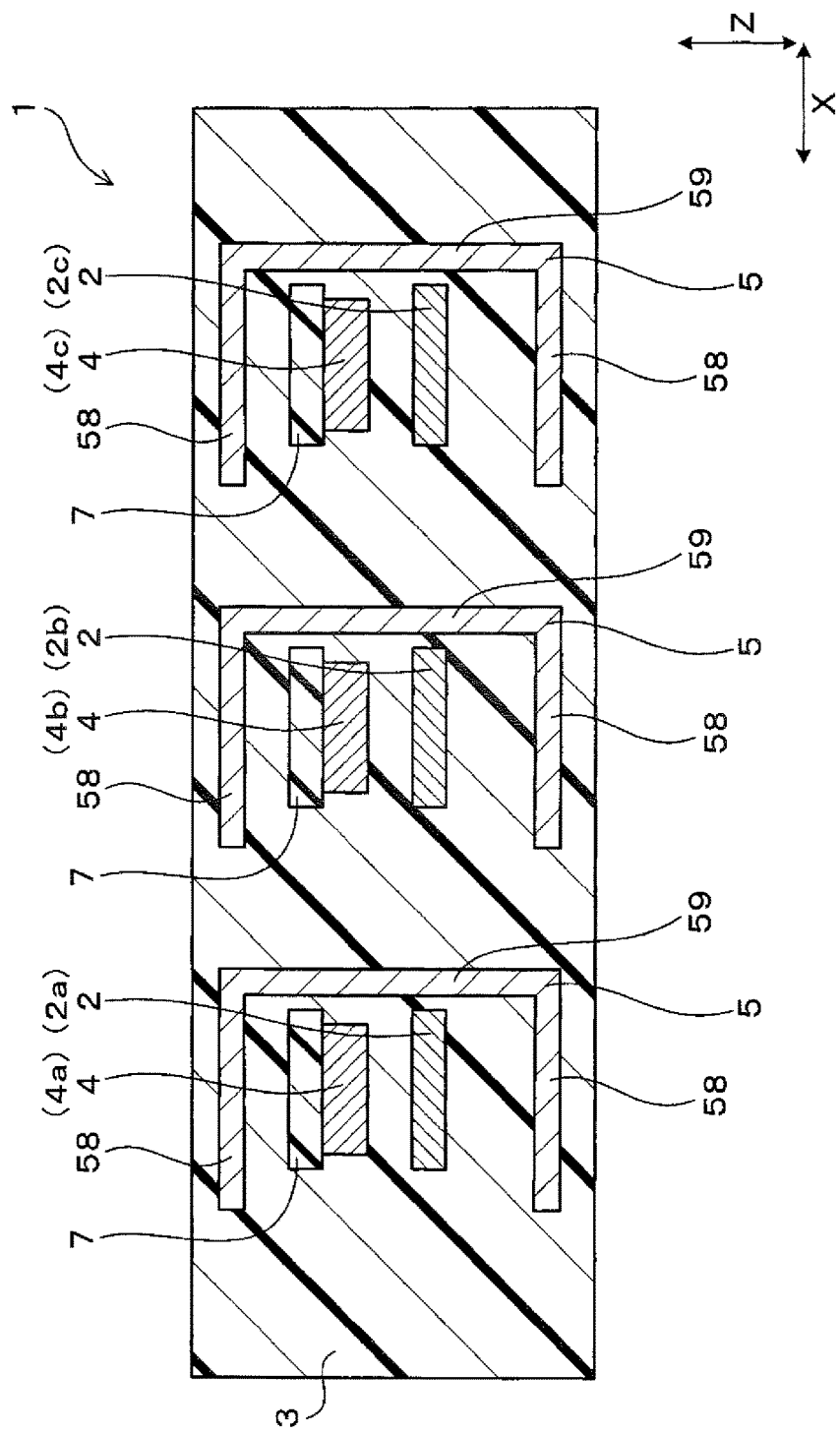
FIG. 16 is a cross-sectional view of a current sensor-equipped bus bar module according to a seventh embodiment.

With the present embodiment, the shape of the shield plate 5 is changed. As shown in FIG. 16, a shield plate 5 of the present embodiment includes two main plate portions 58 and one connecting portion 59. The single connecting portion 59 connects the two main plate portions 58. A bus bar 2 and a current sensor 4 are covered from both sides in the Z direction, by the two main plate portions 58. In other respects, the structure and advantageous effects are the same as those of the first embodiment.

Eighth Embodiment

Figure 17:
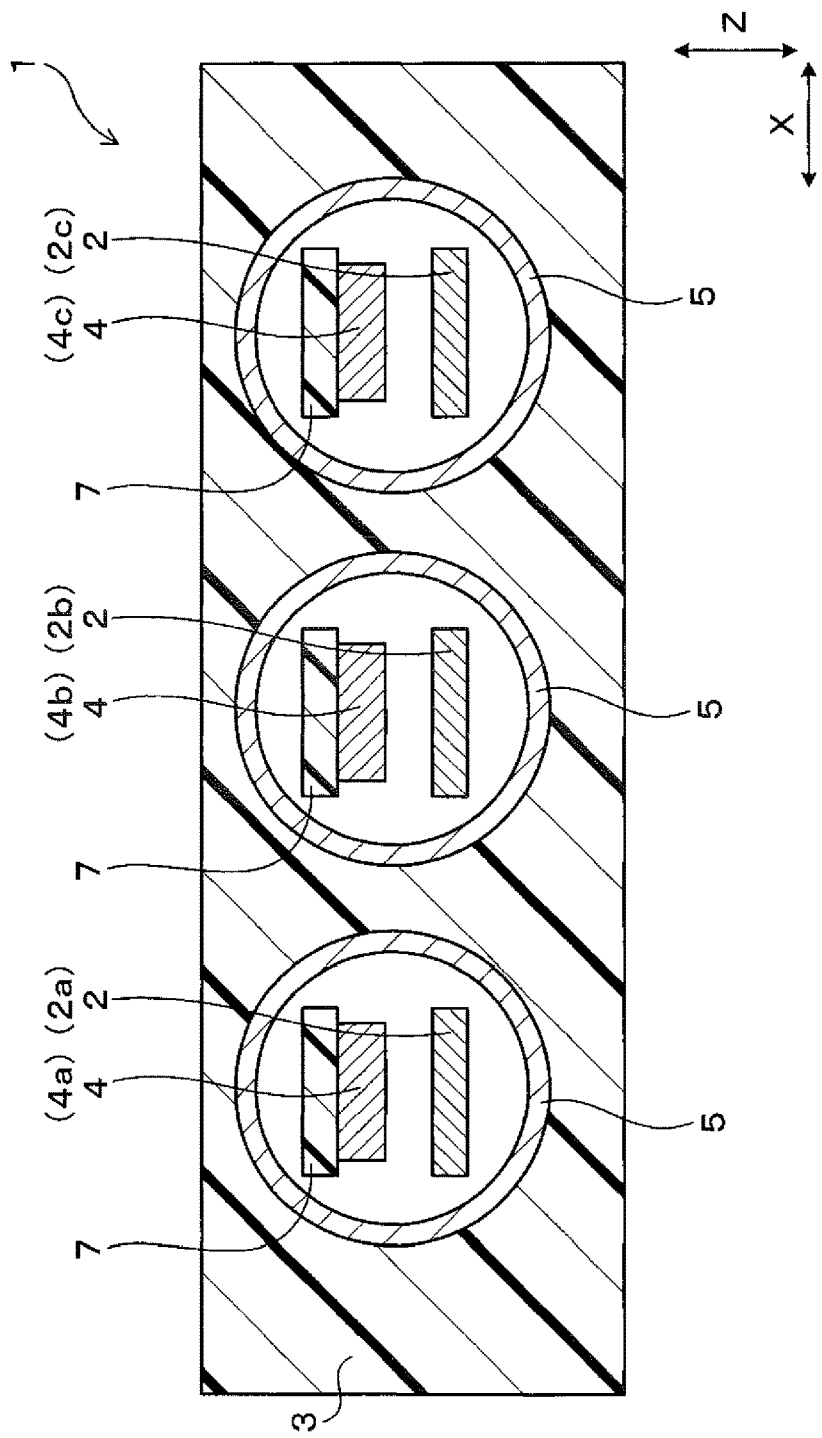
FIG. 17 is a cross-sectional view of a current sensor-equipped bus bar module according to an eighth embodiment.

With the present embodiment, the shape of the shield plate 5 is changed. As shown in FIG. 17, a shield plate 5 is formed in a cylindrical shape. A bus bar 2, a current sensor 4 and a sensor circuit board 7 are disposed within the cylindrical shield plate 5. The bus bar 2 and the current sensor 4 are covered from both sides in the Z direction, by the cylindrical shield plate 5.

In other respects, the structure and advantageous effects are the same as those of the first embodiment.

REFERENCE SIGNS LIST

1 Current sensor-equipped bus bar module
2 Bus bar
3 Sealing member
4 Current sensor
5 Shield plate

The invention claimed is:

1. A current sensor-equipped bus bar module comprising:
a plurality of bus bars in which currents flow;
a current sensor which measures a value of current in one of the plurality of bus bars;
a sealing member which seals the plurality of bus bars to form an integral body, a part of the sealing member is interposed between the current sensor and the bus bars; and
a shield plate which shields magnetic fields generated around the bus bars, wherein:
the current sensor comprises a magneto-resistive element, and measures the value of current in the one of the plurality of bus bars by detecting a strength of the magnetic field which is generated around the one of the plurality of bus bars;
the plurality of bus bars are arrayed along a width direction that is at right angles to an extension direction of the bus bars and to a thickness direction of the bus bars;
the current sensor is disposed adjacent to the one of the plurality of bus bars in the thickness direction, and spaced apart from the bus bars; and
the current sensor and the bus bars are covered from both sides, in the thickness direction, by the shield plate.

2. The current sensor-equipped bus bar module according to claim 1, wherein there are a plurality of the current sensors, one of the current sensors for each of the plurality of bus bars.

3. The current sensor-equipped bus bar module according to claim 1, wherein there are a plurality of the current sensors, and at least one of the plurality of bus bars does not include any of the current sensors.

4. The current sensor-equipped bus bar module according to claim 1, wherein at least one of the plurality of bus bars includes a plurality of the current sensors.

5. A current sensor-equipped bus bar module comprising:
a plurality of bus bars in which currents flow;
a sealing member which seals the plurality of bus bars to form an integral body; and
a current sensor which measures a value of current in one of the plurality of bus bars, wherein:

the current sensor comprises a magneto-resistive element, and measures the value of current in the one of the plurality of bus bars by detecting a strength of the magnetic field generated around the one of the plurality of bus bars;

the plurality of bus bars are arrayed along a width direction that is at right angles to an extension direction of the bus bars and to a thickness direction of the bus bars;

the current sensor is disposed adjacent to the one of the plurality of bus bars in the thickness direction, and spaced apart from the bus bars; and at least a pair of shield plates are provided, which are positioned sandwiching the current sensor and the bus bars in the thickness direction to shield the magnetic field.

6. The current sensor-equipped bus bar module according to claim 5, wherein a part of the sealing member is interposed between the current sensor and the bus bars.

7. The current sensor-equipped bus bar module according to claim 5, wherein a gap is formed between the current sensor and the sealing member.

8. The current sensor-equipped bus bar module according to claim 5, wherein the pair of shield plates are disposed at positions sandwiching the current sensor and the bus bars in the thickness direction, a recess is formed in the sealing member, with the current sensor being contained within the recess, a lid is attached to the sealing member for covering an aperture of the recess, one shield plate of the pair of shield plates is sealed in the sealing member, and the other shield plate of the pair of shield plates is sealed in the lid.

9. The current sensor-equipped bus bar module according to claim 5, wherein there are a plurality of the current sensors, one of the current sensors for each of the plurality of bus bars.

10. The current sensor-equipped bus bar module according to claim 5, wherein there are a plurality of the current sensors, and at least one of the plurality of bus bars does not include any of the current sensors.

11. The current sensor-equipped bus bar module according to claim 5, wherein at least one of the plurality of bus bars includes a plurality of the current sensors.

* * * * *